United States Patent [19]
Hosier

[11] Patent Number: 6,157,019
[45] Date of Patent: Dec. 5, 2000

[54] EDGE PHOTOSITE DEFINITION BY OPAQUE FILTER LAYER

[75] Inventor: Paul A. Hosier, Rochester, N.Y.

[73] Assignee: Xerox Corporation, Stamford, Conn.

[21] Appl. No.: 09/282,317

[22] Filed: Mar. 31, 1999

[51] Int. Cl.[7] .................. H01L 27/00; H01L 31/062; H01L 31/0232
[52] U.S. Cl. .............. 250/208.1; 257/291; 257/435; 438/73
[58] Field of Search .................. 250/214.1, 208.1, 250/216; 257/80–82, 291, 431–436; 438/73

[56] References Cited

U.S. PATENT DOCUMENTS

| | | | |
|---|---|---|---|
| 4,727,407 | 2/1988 | Nobue et al. | 357/30 |
| 5,430,321 | 7/1995 | Effelsberg | 257/463 |
| 5,473,513 | 12/1995 | Quinn | 361/760 |
| 5,567,976 | 10/1996 | Dierschke et al. | 257/443 |
| 5,691,760 | 11/1997 | Hosier et al. | 347/238 |
| 5,696,626 | 12/1997 | Hosier et al. | 358/482 |
| 5,848,331 | 12/1998 | Fromm | 399/122 |
| 5,909,041 | 6/1999 | Hosier et al. | 257/292 |
| 6,066,883 | 5/2000 | Hosier et al. | 257/452 |

*Primary Examiner*—Scott J. Sugarman
*Attorney, Agent, or Firm*—Paul F. Daebeler

[57] ABSTRACT

The present invention relates to photosensitive chips for creating electrical signals from an original image, as would be found for example in a digital scanner, copier, facsimile machine, or other document generating or reproducing device. More specifically, the present invention provides a way of shielding the edge photosites with an opaque layer that overlaps the diced region and preserves the integrity of the filter layers while eliminating the need for a guardring to decrease the dead space and consequently reduce the undesirable effects of Moiré patterns.

19 Claims, 10 Drawing Sheets

EDGE PHOTOSITE DEFINITION BY OPAQUE FILTER LAYER

FIELD OF THE INVENTION

The present invention relates to photosensitive chips for creating electrical signals from an original image, as would be found for example in a digital scanner, copier, facsimile machine, or other document generating or reproducing device. More specifically, the present invention relates to shielding an edge photosite with an opaque filter layer that overlaps a diced region of a semiconductor wafer in order to reduce Moiré patterns.

BACKGROUND OF THE INVENTION

Image sensor arrays typically comprise a linear array of photosensors which raster scan an image bearing document and convert the microscopic image areas viewed by each photosensor to image signal charges. Each photosensor collects light from a corresponding photosite. Following an integration period, the image signal charges are amplified and transferred as an analog video signal to a common output line or bus through successively actuated multiplexing transistors. One example of such an array is a charged-coupled device (CCD).

For high-performance image sensor arrays, a preferred design includes an array of photosites of a width comparable to the width of a page being scanned, to permit one-to-one imaging generally without the use of reductive optics. In order to provide such a "full-width" array, however, relatively large silicon structures must be used to define the large number of photosites. A preferred technique to create such a large array is to align several butted silicon chips, each chip defining a small linear array thereon.

The silicon chips which are butted to form a single full-width array are typically created by first creating the circuitry for a plurality of individual chips on a single silicon wafer. The silicon wafer is then cut or "diced," around the circuit areas to yield discrete chips. Typically, the technique for dicing the chips includes a combination of chemical etching and mechanical sawing. On each chip, photosites are spaced with high resolution from one end of a chip to the other; the length of each diced chip from one end of the array thereon to the other requires precision dicing. It would be desirable to dice each individual chip with a precise dimension along a linear array of photosites, so that, when a series of chips are butted end-to-end to form a single page-width linear array, there is a minimum disruption of spacing from an end photosite on one chip to a neighboring photosite at the end of a neighboring chip. Ideally, the spacing, or pitch, across an entire full-width linear array should be consistent regardless of the configuration of silicon chips forming the array. Pitch is the distance between the center points of two adjacent photosites.

Preferably, the full-width array extends the entire length of a document, such as eleven inches. Usually, the full-width array is used to scan line by line across the width of a document with the document being moved or stepped lengthwise in synchronism therewith. A typical architecture for such a sensor array is given, for example, in U.S. Pat. No. 5,473,513. When the original document moves past the full-width array, each of the photosites receives reflected light and the corresponding photosensors convert reflected light from the original image into electrical signals. The motion of the original image perpendicular to the linear array causes a sequence of signals to be output from each photosensor, which can be converted into digital data.

With the gradual introduction of color-capable products into the office equipment market, it has become desirable to provide scanning systems which are capable of converting light from full-color images into separate trains of image signals, each train representing one primary color. In order to obtain the separate signals relating to color separations in a full-color image, one technique is to provide on each semiconductor chip multiple parallel linear arrays of photosites with corresponding photosensors, each of the parallel arrays being sensitive to one primary color. Typically, this arrangement can be achieved by providing multiple linear arrays of photosites which are physically identical except for a translucent primary-color overlay over photosites for that linear array. In other words, the linear array which is supposed to be sensitive to red light only will have a translucent red layer placed on the photosites thereof, and such would be the case for a blue-sensitive array and a green-sensitive array. Although it is preferable to use three linear arrays, any number of linear arrays can be used. As the chips are exposed to an original full-color image, only those portions of the image, which correspond to particular primary colors, will reach the photosensors assigned to the primary color. Thus, the photosite determines what portions of the image will reach the photosensors.

The most common substances for providing these translucent filter layers over the photosites is polyimide or acrylic. For example, polyimide is typically applied in liquid form to a batch of photosensitive chips while the chips are still in undiced, wafer form. After the polyimide liquid is applied to the wafer, the wafer is centrifuged to provide an even layer of a particular polyimide. In order to obtain the polyimide having the desired primary-color-filtering properties, it is well known to dope the polyimide with either a pigment or dye of the desired color, and these dopants are readily commercially available. When it is desired to place different kinds of color filters on a single chip, a typical technique is to first apply an even layer of polyimide over the entire main surface of the chip (while the chip is still part of the wafer) and then remove the unnecessary parts of the filter by photo-etching or another well known technique. Typically, the entire filter layer placed over the chip is removed except for those areas over the desired set of photosites. Acrylic is applied to the wafer in a similar manner.

In the prior art, there was a problem in that a guardring diffusion layer and light blocking layer were placed next to the edge photosite of each chip as in U.S. patent application Ser. No. 09/039,523 now U.S. Pat. No. 6,066,883. The light blocking layer was typically a metal light shield layer. These layers reduced the size of the edge photosite. Since all of the photosites should be the same size to provide high quality digital imaging capability, all of the photosites on each chip are reduced. Although defining the edge photosites is helpful in reducing Moire patterns as taught by U.S. pat. application Ser. No. 09/039,523, now U.S. Pat. No. 6,066,883 there is a need to further reduce Moiré patterns by increasing the size of the photosites.

SUMMARY OF THE INVENTION

According to one aspect of the present invention, a photosensitive chip includes an edge at least one linear array of photosites having a uniform pitch and including at least one edge photosite, and an opaque layer being deposited between the edge of the photosensitive chip and said at least one edge photosite. In another aspect of the present invention, a plurality of the photosensitive chips are attached to a substrate, wherein the photosensitive chips are juxtaposed with one another, to form an assembly of chips. The assembly of chips can be a full width array, which can be incorporated into a raster input scanner of a digital device.

DETAILED DESCRIPTION OF THE PRESENT INVENTION

Figure 1:
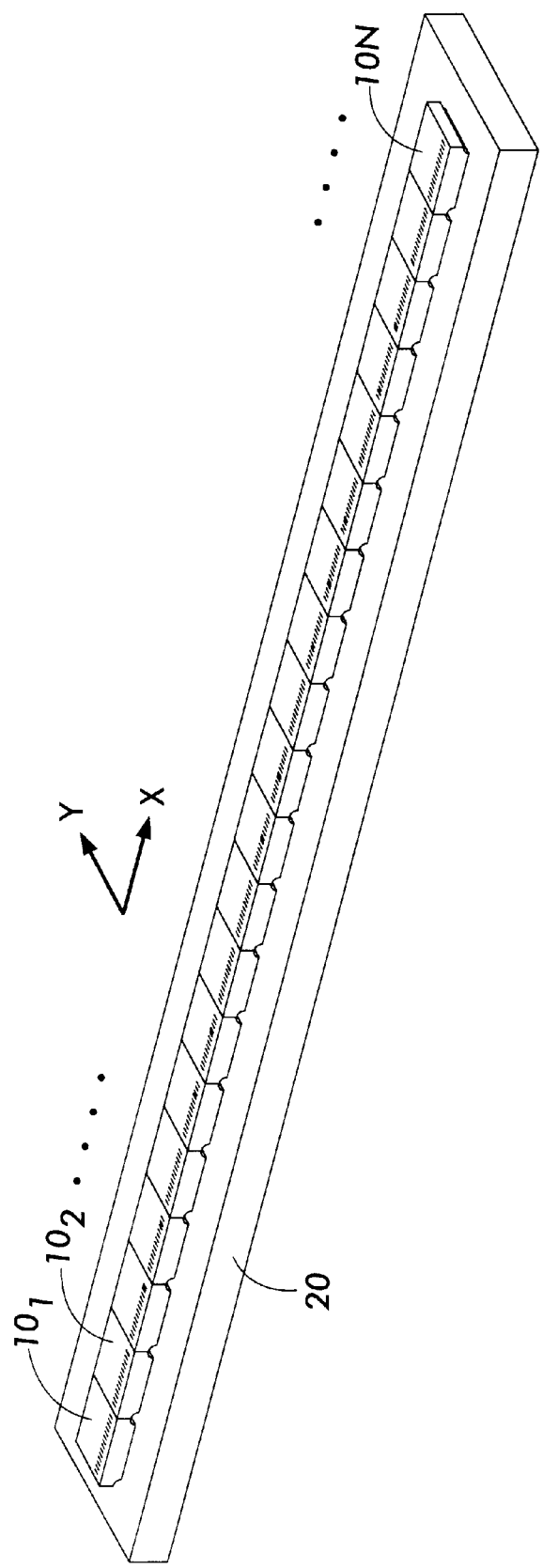
FIG. 1 is a perspective view of a base substrate having a plurality of butted chips mounted thereon to form a full width array.

FIG. 1 shows a plurality of chips 10 mounted and butted on a substrate 20 from end to end to form an effective collinear array of photosites, which extends across a page image being scanned for a scanner, copier, facsimile machine or other document reading or generating device. Generally, each individual photosite receives reflected light and each corresponding photosensor is adapted to output a charge or voltage signal indicative to the intensity of light of a certain type received through the photosite; various structures, such as transfer circuits, or charged coupled devices, are known in the art for processing signal output by the various photosites.

Figure 2:
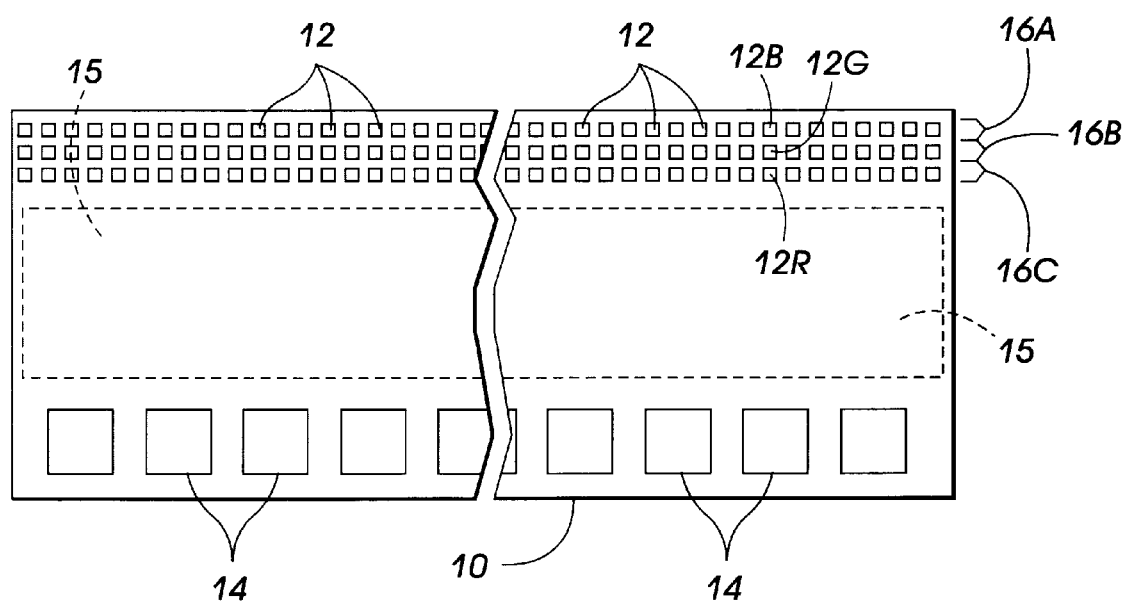
FIG. 2 is a plan view showing a chip relevant to the present invention.

FIG. 2 is a plan view showing one of these photosensitive chips 10 relevant to the claimed invention. The chip 10 is generally made of a semiconductor substrate, as is known in the art, in which circuitry and other elements are formed, such as by photolithographic etching. A few of the most relevant structures are one or more linear arrays of photosites 12, each of which forms the photosensitive surface of circuitry within the chip 10, and a set of bonding pads 14. The photosites 12 are typically arranged in a linear array along one main dimension of the chip 10, with each photosite 12 along the array corresponding to one pixel in an image signal. As will be described in detail below, the photosites 12 are preferably for sensing the three primary colors, blue, green and red. Photosites, which sense blue, green and red, are referred to as photosites 12B, 12G and 12R. Each photosite is associated with a corresponding photosensor. Preferably, the photosites are uniformly spaced to provide a uniform pitch, which enhances digital signal processing. Pitch is the distance between the center of one photosite and the center of an adjacent photosite. Preferably, there are three parallel linear arrays 16a, 16b, and 16c for the three primary colors. However, any number of linear arrays may be utilized. For example, only one linear array could be placed on the chip for use in a monochrome scanner, copier, printer, etc.

The bonding pads 14 are distinct surfaces on the main surface of the chip 10, and are intended to accept wire bonds attached thereto. The bonding pads 14 thus serve as the electronic interface between the chip 10 and any external circuitry. The circuitry for obtaining signals related to light directed to the photosites 12, and for unloading image data from the chip 10 is generally indicated as 15. The circuitry 15 is generally deposited between the linear array of photosites 12 and a linear array of bonding pads 14.

Figure 3:
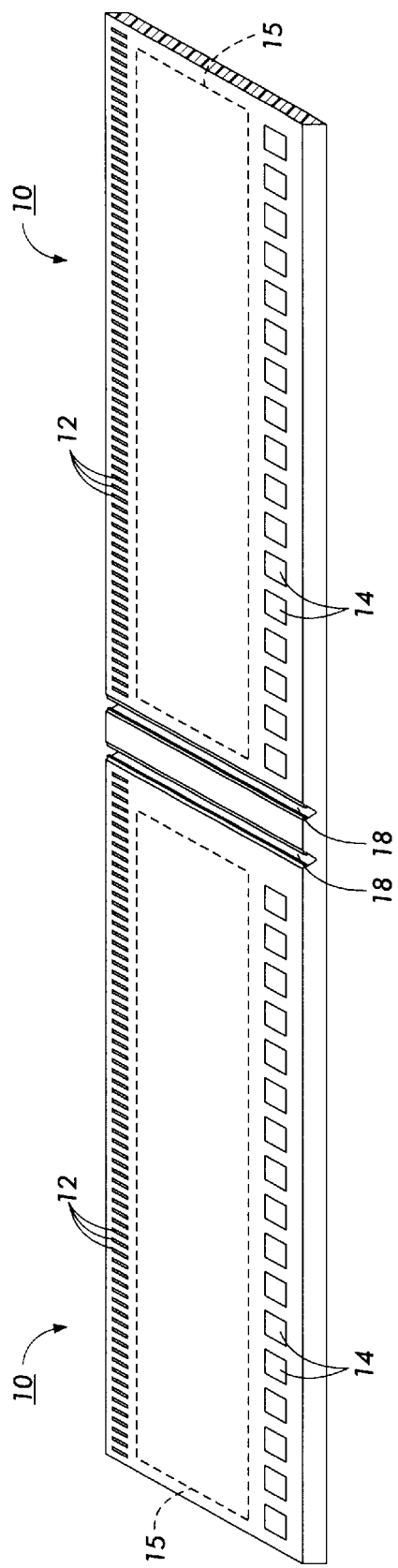
FIG. 3 is a perspective view showing two chips relevant to the present invention.

Chips 10 are typically formed in batches on semiconductor wafers, which are subsequently cleaved, or "diced," to create individual chips. Typically, the semiconductor wafers are made of silicon. As is known in the art, photolithographically etched V-grooves 18 define precisely the intended boundaries of a particular chip 10 for dicing as shown in the perspective view of two adjacent chips 10 in FIG. 3. Thus, all of the photosites 12, bonding pads 14 and circuitry 15 for relatively large number of chips 10 are etched simultaneously onto a single semiconductor wafer. The region between the V-grooves 18 is called the tab region. The photosites 12 adjacent to each V-groove in FIG. 3 (adjacent to the edge as shown in FIG. 2) are referred to as an edge or outer photosites. The other photosites 12 are referred to as inner photosites.

Figure 4:
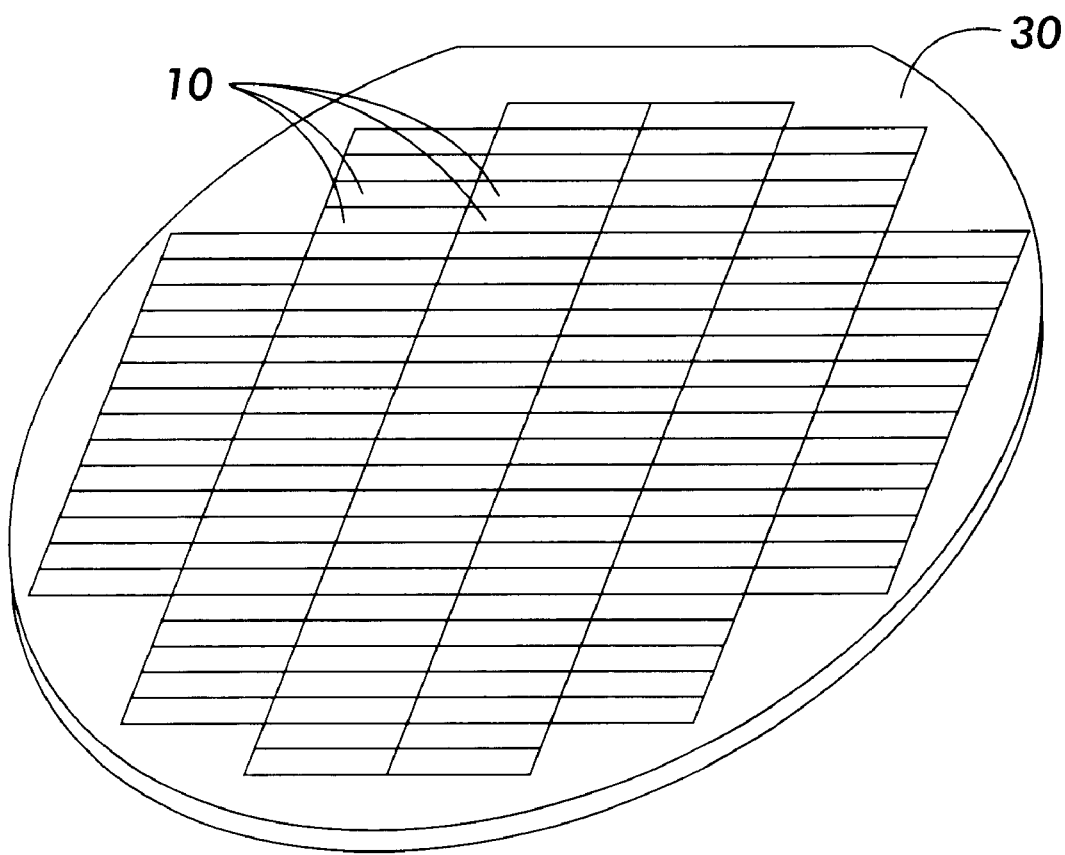
FIG. 4 is a perspective view of a semiconductor wafer relevant to the present invention.

FIG. 4 shows a typical semiconductor wafer 30, in isolation, wherein a relatively large number of chips 10 are created in the wafer 30 prior to dicing thereof. Each chip 10 has a distinct chip area within the main surface of the wafer 30. The phrase "chip area" refers to a defined area within the main surface of the wafer 30 which is intended to comprise a discrete chip 10 after the dicing step, when individual chips 10 (FIG. 2) are separated from the rest of the wafer 30.

Figure 5:
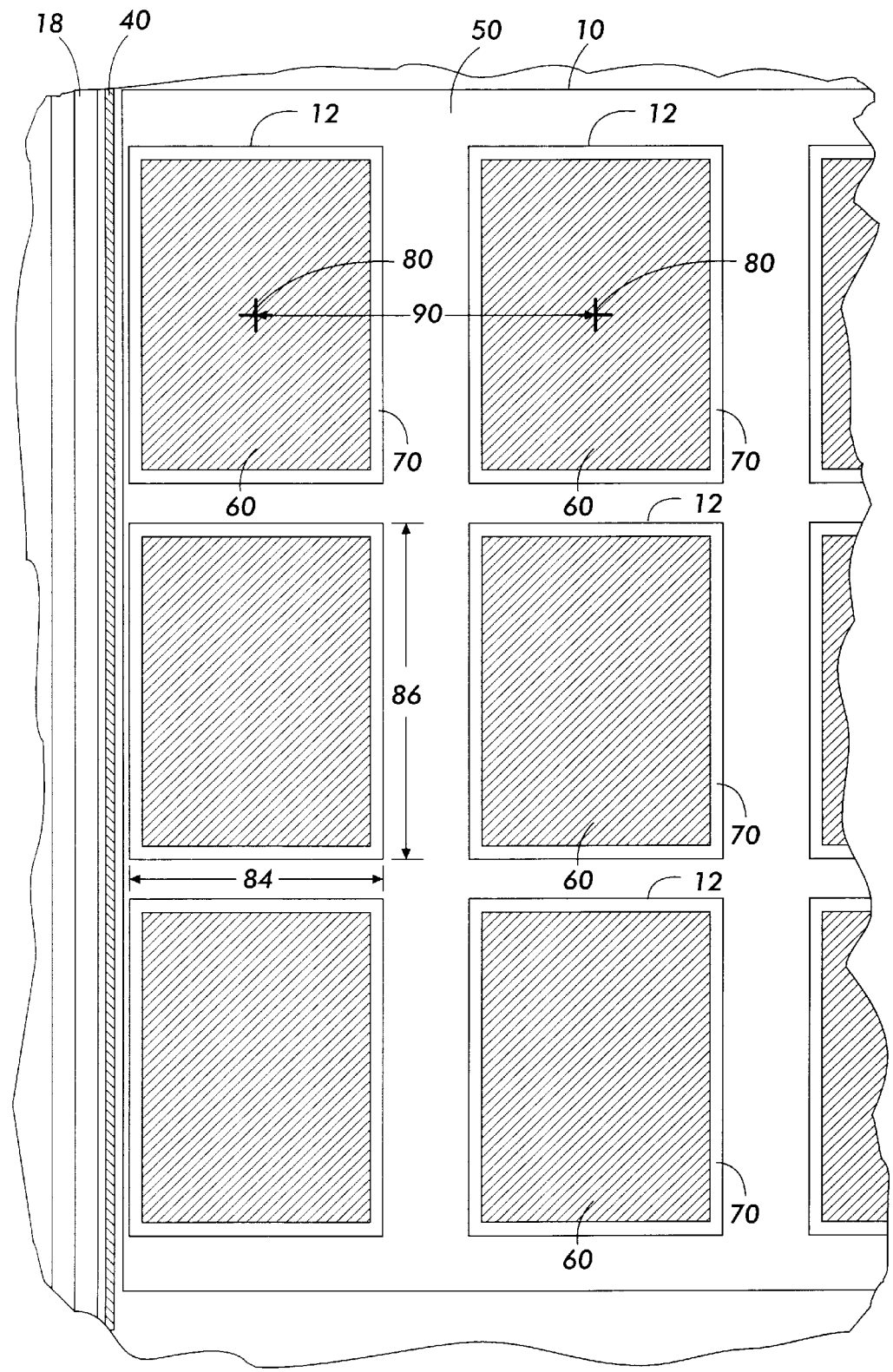
FIG. 5 is a partial plan view showing a prior art interior and edge pixel layout with photosites having area shaped photosensors.
Figure 6:
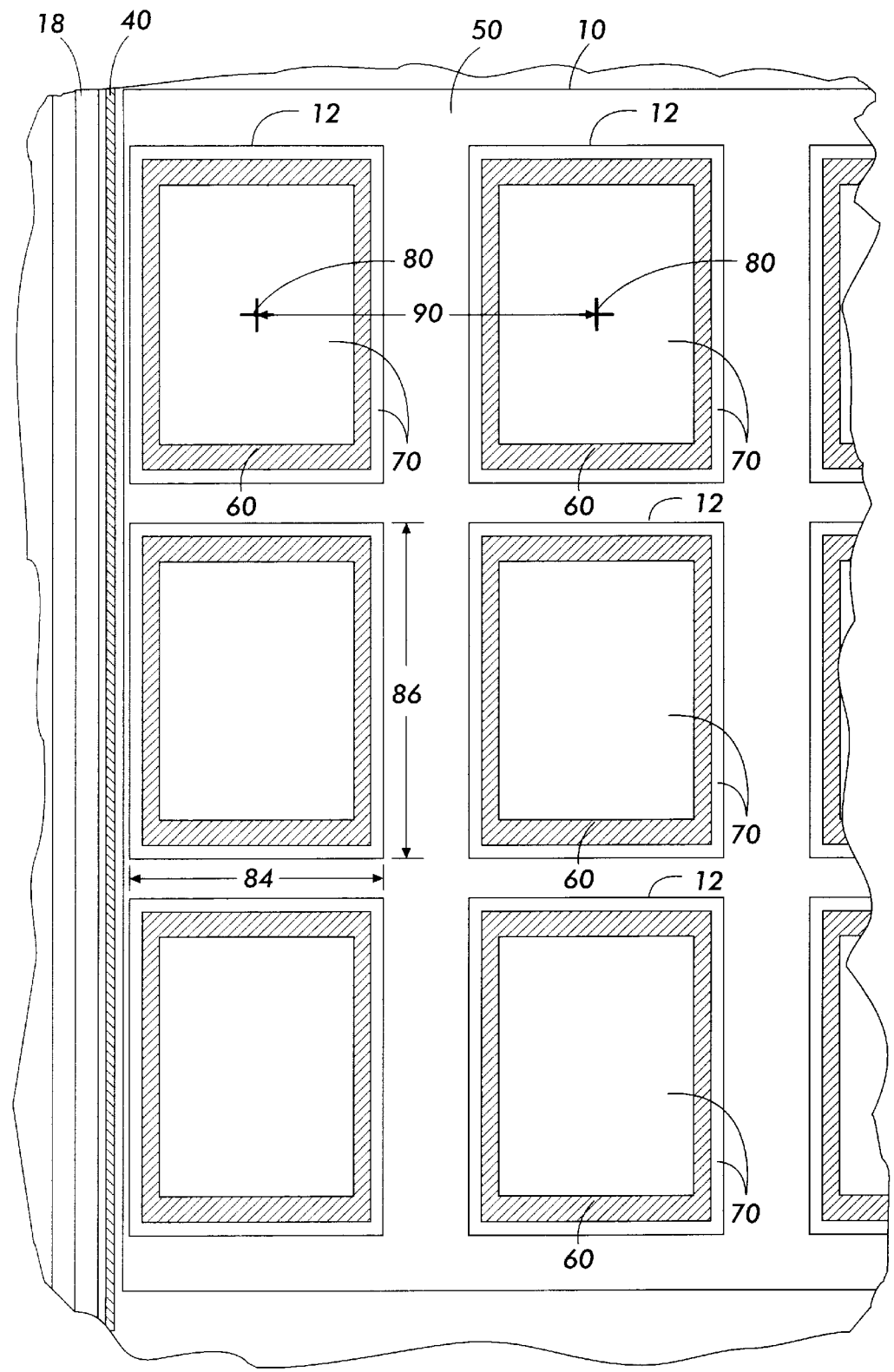
FIG. 6 is a partial plan view showing another prior art interior and edge pixel layout with photosites having donut shaped photosensors.

In the prior art in FIGS. 5–6, a guardring diffusion layer 40 and a metal light shield layer 50 were placed next to the edge photosite 12 to define the An photosite 12 as taught by U.S. patent application Ser. No. 09/039,523. A photosite 12 is an opening in metal light shield layer 50 or similar layer. The metal light shield layer 50 blocks light. Without the guardring diffusion layer 40 and metal light shield layer 50, the edge photosites 12 may have collected light from a greater surface area of the chip 10 than the other photosites 12 (pixel openings) causing a nonuniform pixel pitch on each chip 10. Consequently, the pixel pitch across the full width array varies greatly. A nonuniform pitch adversely impacts digital processing including increasing the likelihood of Moiré patterns and of other defects appearing on documents, which are generated based on information from a single chip or multichip scanning device.

Moiré is an undesirable image quality defect that is caused by the beating of sensor sampling frequency and frequency of the scanned target. This beating frequency is easily seen when it is a low frequency and the best signal amplitude is larger. The beat frequency is just the difference of the sensor and target frequencies.

FIGS. 5–6 show the prior art interior and edge pixel layouts with area shaped and donut shaped photosensors. A photosensor may be any device capable of sensing light such as a photodiode or photogate. Each photosensor collects the light received by the corresponding photosite 12.

FIG. 5 shows the V-groove 18, guardring 40 and metal light shield layer 50. Photosites 12 have a photosensor having an n region 60 and a p region 70, which provide a photosensor called a photodiode. However, any type of photosensor may be employed at a particular photosite. For example, FIG. 6 shows a photosite 12 having a photosensor having an n region 60 and two p regions 70, which provide a donut shaped photodiode. The uniform pixel pitch, shown by reference numeral 90, is the distance between center points 80 of adjacent photosite 12. Each pixel opening or photosite 12 has a pixel width 84 and a pixel height 86.

The diffusion length of minority carriers within a photosite 12 (pixel opening) is long enough that all charge entering a photosite 12 is collected. Therefore, the photosensor shape does not define the pixel opening or shape of the photosite 12. The light opening area in the metal light shield layer 50 determines the pixel opening size, which includes the pixel height 86 and the is pixel width 84. As can be seen in FIGS. 5–6, the pixel opening or photosite 12 is reduced substantially by the edge photositeN-groove considerations, and considerations of constant pitch and response for all pixels as discussed above.

Figure 9:
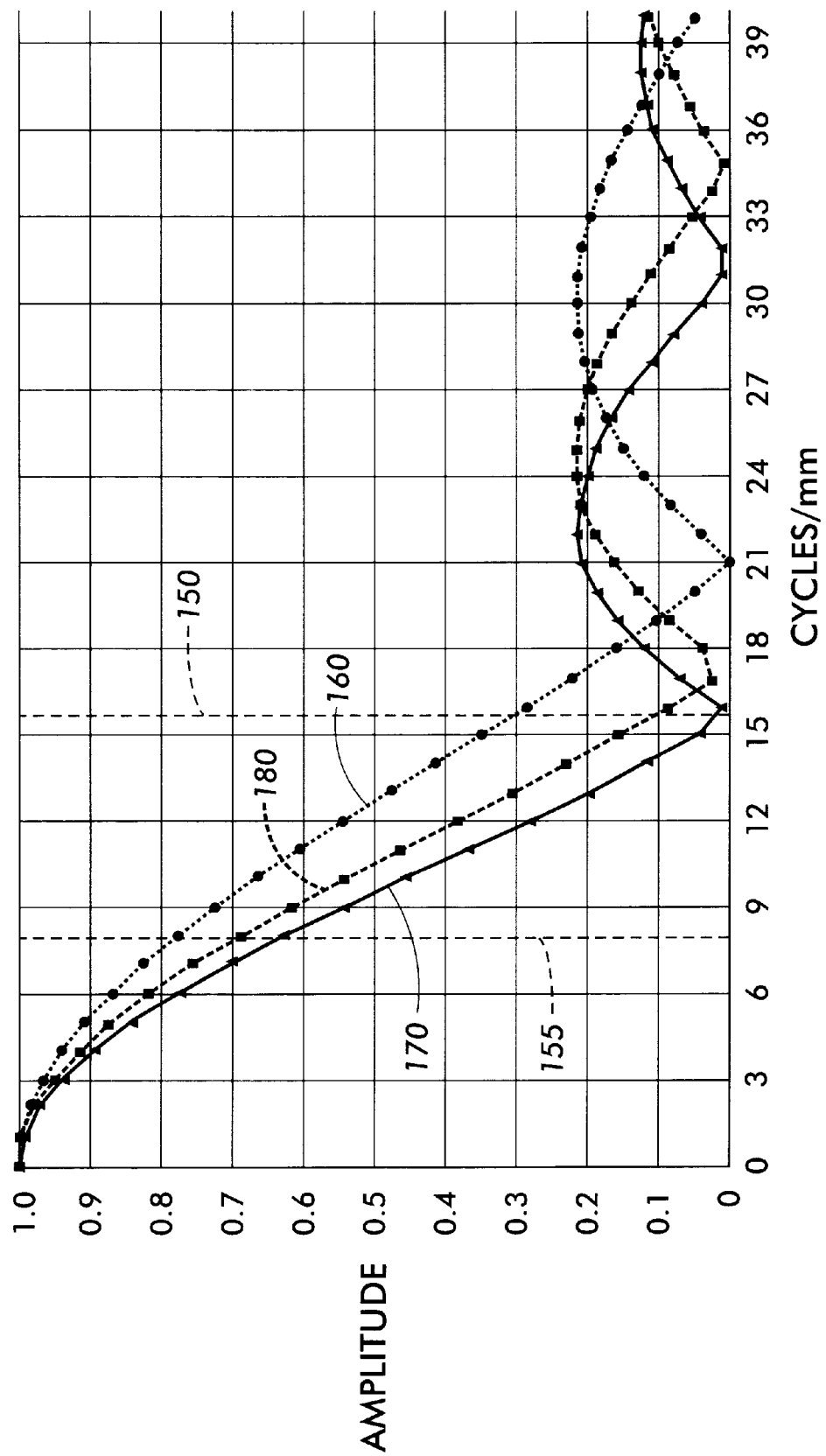
FIG. 9 is a graph comparing the modulation transfer function of the present invention with the modulation transfer function of the prior art.

A problem with the pixel layouts in FIG. 5–6 can be seen in the MTF (Modulation Transfer Function) curves shown in FIG. 9. The MTF curves show a chip 10 having pixel opening spatial frequency for 400 SPI pitch with pixel openings of various sizes. If the guardrings 40 and metal light shield layer 50 are deposited on the chip 10 to define the edge photosites 12, then the pixel width 84 is 47.5 micrometers. The corresponding MTF function is shown in FIG. 9 and indicated generally by reference numeral 160. To minimize sample aliasing, or Moiré, it is best to have an MTF close to zero at the sampling frequency 150. (The Nyquist frequency is shown by reference numeral 155.) As discussed above, Moiré is an undesirable image quality defect that is caused by the beating of sensor sampling frequency and frequency of the scanned target. This beating frequency is easily seen when it is a low frequency and the beat signal amplitude is large. The beat frequency is just the difference of the sensor and target frequencies, and the amplitude will be determined by the total system MTF. The total system MTF is the product of the MTF of the sensor and the MTF of the optics path. Therefore, given that the optics MTF is not zeroing at the sampling frequency 150, it is easy to see how the sensor MTF of 0.3 at the sampling frequency 150, which could result in visible Moiré as shown by MTF curve 160.

If there were no metal light shield layer 50 and no guardring diffusion layer 40 at all, the pixel width 84 would be 63.5 micrometers. The corresponding MTF function is shown in FIG. 9 and indicated by reference numeral 170. However, the edge photosites 12 would not be defined. Since the dicing process of the silicon wafer 30 into chips 10 is a manufacturing process utilizing machines that cut the silicon wafer 30 within a small tolerance range, the exact size of the chip 10 could vary slightly. Therefore, the photosensitive area from the edge of the chip 10 to the edge photosite 12 on each chip 10 may be different. This causes digital signal processing problems and increases the likelihood of Moiré patterns as discussed above. Therefore, there is a need to decrease the amplitude of the modulation transfer function at the sampling frequency 150 while defining the edge photosites 12 on chips 10 to avoid digital signal processing problems and reduce Moiré patterns.

In the prior design of FIGS. 5–6, the edge pixels 12 were defined by metal light shield layer 60 on all four sides. A guardring 40 is used to pick up stray light on the V-groove 18 because of process compatibility reasons as discussed in U.S. application Ser. No. 09/039,523, now U.S. Pat. No. 6,066,883 Even though there is some variability in the dicing location in the V-groove 18, this variation in chip length does not affect the response of the edge photosite 12 because the guardring 40 would pick up all stray light in the V-groove 18 region. The guarding 40 and metal light shield layer 50 on the chip edge greatly reduce the size of the edge photosites 12, and all other pixel openings because of uniformity considerations.

Figure 7:
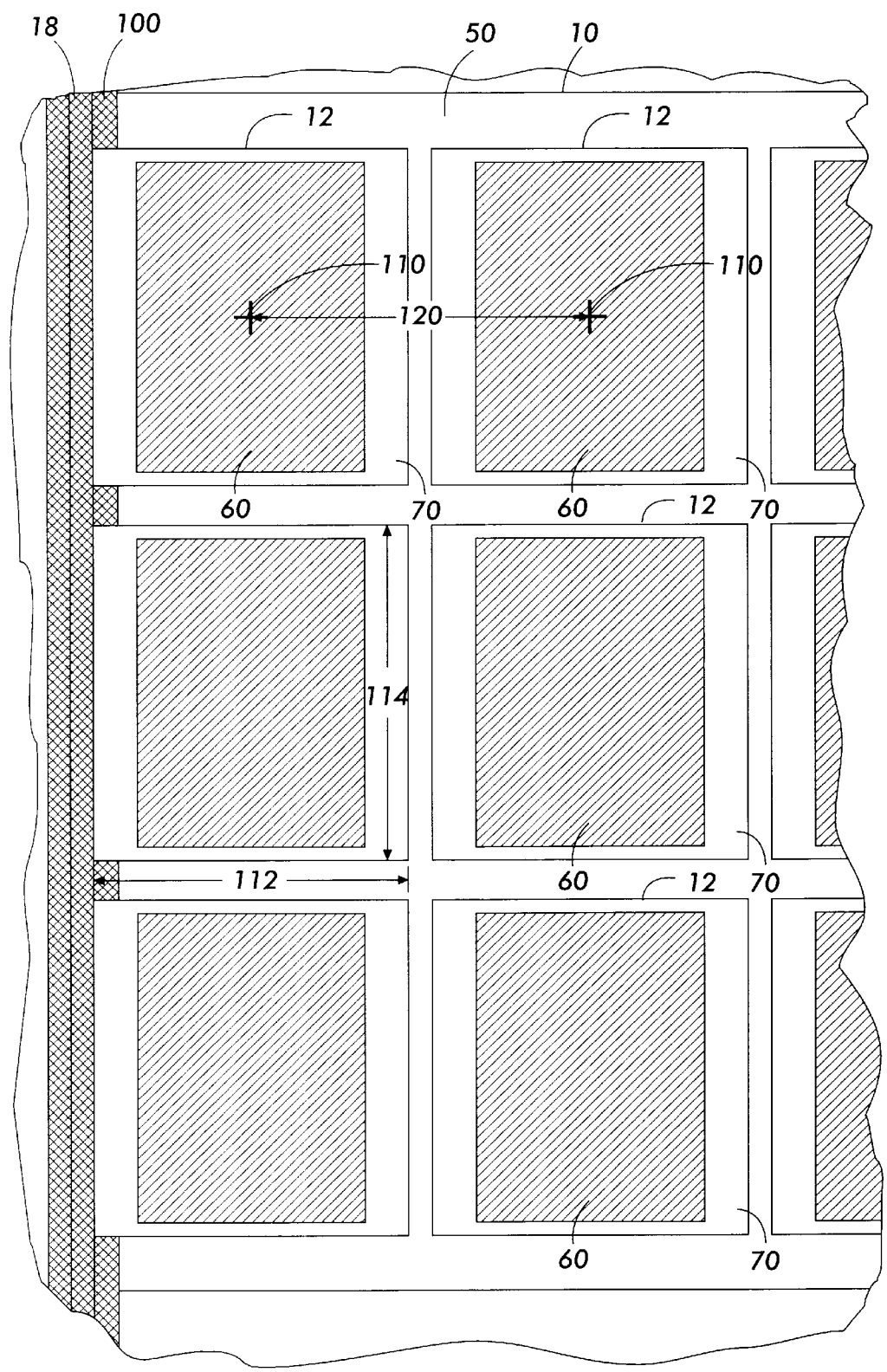
FIG. 7 is a partial plan view showing an interior and edge pixel layout according to a first embodiment of the present invention.
Figure 8:
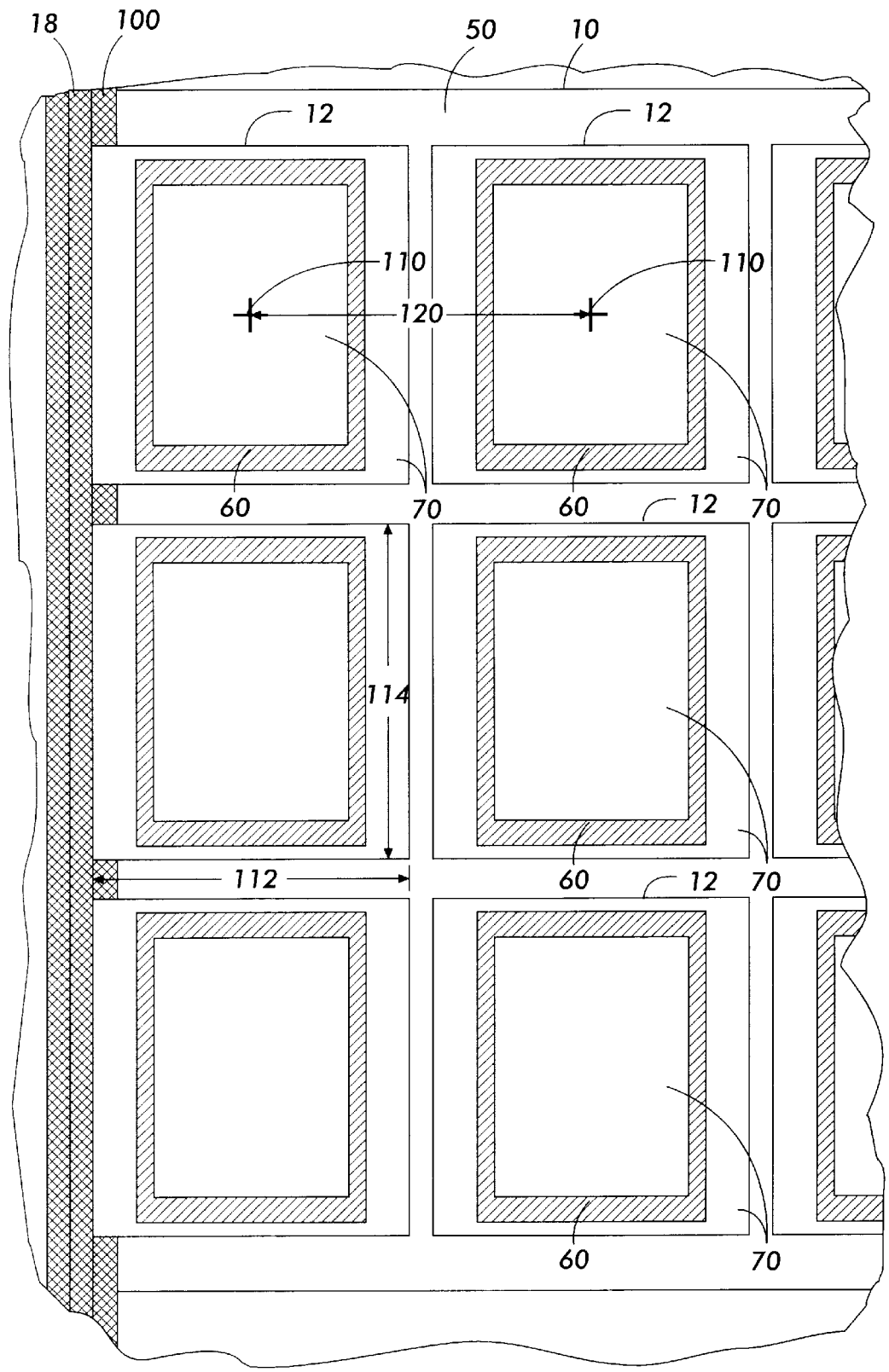
FIG. 8 is a partial plan view showing an interior and edge pixel layout according to a second embodiment of the present invention.

FIGS. 7–8 show one way of increasing the photosite, which is also called the pixel opening size. FIG. 7 shows the V-groove 18 and metal light shield layer 50. Photosites 12 have a photosensor having an n region 60 and a p region 70, which provide a photosensor called a photodiode. However, any type of photosensor may be employed at a particular photosite. For example, FIG. 8 shows a photosite 12 having a photosensor having an n region 60 and two p regions 70, which provide a donut shaped photodiode. The uniform pixel pitch, shown by reference numeral 110, is the distance between center points 120 of adjacent photosites 12. Each pixel opening or photosite 12 has a pixel width 112 and a pixel height 114. Since the guarding diffusion layer 40 and a section of the metal light shield layer 50 are removed, and an opaque filter layer 100 is substituted therefore to define the edge photosite 12, the pixel opening or photosite 12 is significantly larger. Therefore, the pixel width 112 of the present invention (approximately 57.5 micrometers) is significantly larger than the pixel width 84 of the prior art (47.5 micrometers). Generally, the pixel width 112 of the present invention is in the range of 55.5 micrometers to 59.5 micrometers.

The amount of opaque filter layer 100 overlapping the V-groove 18 is slightly greater than the variation of dicing position. In this way, the opaque layer 100 determines the size of the edge photosite 12, and not the diced chip size. In practical terms, a black acrylic filter material or black polyimide filter material can be used for both monochrome and color applications. This material is applied after all other wafer processing adhered to the chip 10. Alternatively, if red and blue filter layers are being deposited on a silicon wafer for a color chip, then these two filter layers can be stacked to generate a virtually opaque layer, without any increased expense.

As can be seen from FIGS. 5–8, the pixel opening can be significantly increased to approximately 57.5 micrometers from 47.5 micrometers by adding an opaque layer 100, so that the metal light shield layer 50 between photosites 12 is minimized. This reduces the MTF to an amplitude of approximately 0.1 or less at the sampling frequency 150 as shown in FIG. 9 and indicated by reference numeral 180.

Moreover, the opaque layer 100 is preferably overlapping the V-grooves 18 by 2–4 micrometers. If the edge photosite 12 is kept on pitch with the interior photosites 12, the space between photosites 12 can be reduced to about 4–8 micrometers for a monochrome sensor. If the pitch is violated slightly on the edge photosite 12 only (which is generally acceptable for digital signal processing), the space between photosites 12 can be reduced to as low as 2 or 3 micrometers for a color sensor. Consequently, the pixel width 112 of the present invention is further improved to a range of 55.5 to 61.5 in this alternative embodiment of the present invention.

Although the embodiments show three linear arrays 16*a*–16*c* with primary color filters, it will be understood by one having ordinary skill in the art that the embodiments of the present invention shown in FIGS. 7–8 may be used for one linear array or any number of linear arrays for monochrome or color scanning.

As can be seen in FIG. 9, one of the best ways to reduce MTF in the critical frequency range (in particular at the sampling frequency 150) is to make the pixel openings or photosites 12 larger, and as close to the pixel pitch as possible.

The present invention provides a way of shielding the edge photosites 12 with an opaque layer 100 that overlaps the diced region and preserves the integrity of the filter layers while eliminating the need for a guardring 40 to decrease the dead space and consequently reduce the undesirable effects of Moiré patterns. The edge photosites do not depend on dicing position. This opaque layer 100 is compatible with other wafer processing steps and is reliable.

Figure 10:
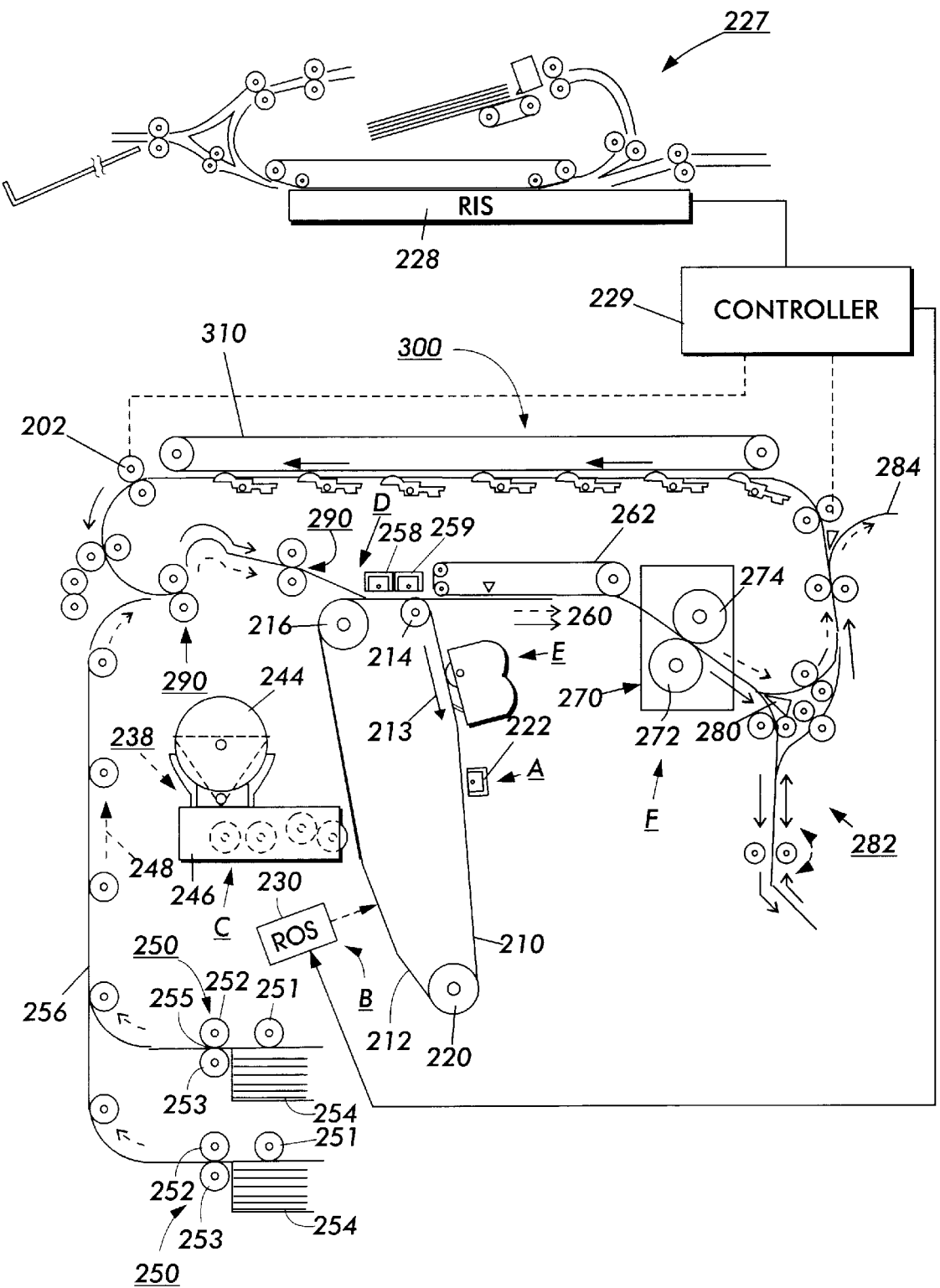
FIG. 10 is a partial schematic elevational view of an example of a digital copier, which can employ the photosensitive chips produced from the first and second embodiments of the present invention.

FIG. 10 is a partial schematic elevational view of a digital copier, which can utilize the photosensitive chips 10 of the present invention by assembling them in generally the same manner as in U.S. Patent No. 5,473,513. However, it is understood that the photosensitive chips 10 may be used together in a full width array or independently in a single chip application in any imaging or scanning device.

An original document is positioned in a document handler 227 on a raster input scanner (RIS) indicated generally by reference numeral 228. The RIS 228 contains document illumination lamps, optics, a mechanical scanning device and a plurality of photosensitive chips 10 as shown in FIG. 1. The photosensitive chips 10 may include a linear array of photosites or multiple parallel linear arrays of photosites as described above. The RIS 228 captures the entire original document and converts it to a series of raster scan lines. This information is transmitted to an electronic subsystem (ESS) or controller 229 which controls a raster output scanner (ROS) 230.

The digital copier employs a photoconductive belt 210. Preferably, the photoconductive belt 210 is made from a photoconductive material coated on a ground layer, which, in turn, is coated on an anti-curl backing layer. Belt 210 moves in the direction of arrow 213 to advance successive portions sequentially through the various processing stations deposited about the path of movement thereof. Belt 210 is entrained about stripping roller 214, tensioning roller 220 and drive roller 216. As roller 216 rotates, it advances belt 210 in the direction of arrow 213.

Initially, a portion of the photoconductive surface passes through charging station A. At charging station A, a corona generating device indicated generally by the reference numeral 222 charges the photoconductive belt 210 to a relatively high, substantially uniform potential.

At an exposure station B, a controller or electronic subsystem (ESS) 229 receives the image signals representing the desired output image and processes these signals to convert them to a continuous tone or grayscale rendition of the image which is transmitted to a modulated output generator, for example the raster output scanner (ROS), indicated generally by reference numeral 230. Preferably, ESS 229 is a self-contained, dedicated minicomputer. The image signals transmitted to ESS 229 may originate from a RIS 228 as described above or another type of scanner utilizing the photosensitive chips 10, thereby enabling the digital copier to serve as a remotely located printer for one or more scanners. Alternatively, the printer may serve as a dedicated printer for a high-speed computer or for one or more personal computers. The signals from ESS 229, corresponding to the continuous tone image desired to be reproduced by the printer, are transmitted to ROS 230. ROS 230 includes a laser with rotating polygon mirror blocks. The ROS 230 will expose the photoconductive belt 210 to record an electrostatic latent image thereon corresponding to the continuous tone image received from ESS 229. As an alternative, ROS 230 may employ a photosensitive array of light emitting diodes (LEDs) arranged to illuminate the charged portion of photoconductive belt 210 on a raster-by-raster basis.

After the electrostatic latent image has been recorded on photoconductive surface 212, belt 210 advances the latent image to a development station, C, where toner, in the form of liquid or dry particles, is electrostatically attracted to the latent image using commonly known techniques. The latent image attracts toner particles from the carrier granules forming a toner powder image thereon. As successive electrostatic latent images are developed, toner particles are depleted from the developer material. A toner particle dispenser, indicated generally by the reference numeral 244, dispenses toner particles into developer housing 246 of developer unit 238.

With continued reference to FIG. 10, after the electrostatic latent image is developed, the toner powder image present on belt 210 advances to transfer station D. A print sheet 248 is advanced to the transfer station, D, by a sheet feeding apparatus, 250. Preferably, sheet feeding apparatus 250 includes a nudger roll 251 which feeds the uppermost sheet of stack 254 to nip 255 formed by feed roll 252 and retard roll 253. Feed roll 252 rotates to advance the sheet from stack 254 into vertical transport 256. Vertical transport 256 directs the advancing sheet 248 of support material into the registration transport 290 and past image transfer station D to receive an image from photoreceptor belt 210 in a timed sequence so that the toner powder image formed thereon contacts the advancing sheet 248 at transfer station D. Transfer station D includes a corona-generating device 258, which sprays ions onto the backside of sheet 248. This attracts the toner powder image from photoconductive surface 212 to sheet 248. The sheet is then detached from the photoreceptor by corona generating device 259 which sprays oppositely charged ions onto the back side of sheet 248 to assist in removing the sheet from the photoreceptor. After transfer, sheet 248 continues to move in the direction of arrow 260 by way of belt transport 262, which advances sheet 248 to fusing station F.

Fusing station F includes a fuser assembly indicated generally by the reference numeral 270 which permanently affixes the transferred toner powder image to the copy sheet. Preferably, fuser assembly 270 includes a heated fuser roller 272 and a pressure roller 274 with the powder image on the copy sheet contacting fuser roller 272. The pressure roller 274 is loaded against the fuser roller 272 to provide the necessary pressure to fix the toner powder image to the copy sheet. The fuser roller 272 is internally heated by a quartz lamp (not shown). Release agent, stored in a reservoir (not shown), is pumped to a metering roll (not shown). A trim blade (not shown) trims off the excess release agent. The release agent transfers to a donor roll (not shown) and then to the fuser roll 272. Or alternatively, release agent is stored in a presoaked web (not shown) and applied to the fuser roll 272 by pressing the web against fuser roll 272 and advancing the web at a slow speed.

The sheet then passes through fuser 270 where the image is permanently fixed or fused to the sheet. After passing through fuser 270, a gate 280 either allows the sheet to move directly via output 284 to a finisher or stacker, or deflects the sheet into the duplex path 300, specifically, first into single sheet inverter 282 here. That is, if the sheet is either a simplex sheet, or a completed duplex sheet having both side one and side two images formed thereon, the sheet will be conveyed via gate 280 directly to output 284. However, if the sheet is being duplexed and is then only printed with a side one image, the gate 280 will be positioned to deflect that sheet into the inverter 282 and into the duplex loop path 300, where that sheet will be inverted and then fed to acceleration nip 202 and belt transports 310, for recirculation back through transfer station D and fuser 270 for receiving and permanently fixing the side two image to the backside of that duplex sheet, before it exits via exit path 284.

After the print sheet is separated from photoconductive surface 212 of belt 210, the residual toner/developer and paper fiber particles adhering to photoconductive surface 212 are removed therefrom at cleaning station E. Cleaning station E includes a rotatably mounted fibrous brush in contact with photoconductive surface 212 to disturb and remove paper fibers and a cleaning blade to remove the nontransferred toner particles. The blade may be configured in either a wiper or doctor position depending on the application. Subsequent to cleaning, a discharge lamp (not shown) floods photoconductive surface 212 with light to dissipate any residual electrostatic charge remaining thereon prior to the charging thereof for the next successive imaging cycle.

Controller or ESS 229 regulates the various printer functions. The controller or ESS 229 is preferably a programmable microprocessor, which controls all of the printer functions hereinbefore described. The controller or ESS 229 provides a comparison count of the copy sheets, the number of documents being recirculated, the number of copy sheets selected by the operator, time delays, jam corrections, etc. The control of all of the exemplary systems heretofore described may be accomplished by conventional control switch inputs from the printing machine consoles selected by the operator. Conventional sheet path sensors or switches may be utilized to keep track of the position of the document and the copy sheets.

While FIG. 10 shows one example of a digital document generating device incorporating photosensitive chips 10, it is understood that chips 10 may be used in a single chip or multichip applications in any digital document reading, generating or reproducing device.

While the invention has been described in detail with reference to specific and preferred embodiments, it will be appreciated that various modifications and variations will be apparent to the artisan. All such modifications and embodiments as may occur to one skilled in the art are intended to be within the scope of the appended claims.

What is claimed is:

1. A photosensitive chip comprising:
   an edge;
   at least one linear array of photosites having a uniform pitch and including at least one edge photosite; and
   an opaque layer being deposited between said edge and said edge photosite.

2. The photosensitive chip as in claim 1, wherein the chip comprises three linear arrays of photosites with three edge photosites, and wherein an opaque layer is deposited between said edge and said edge photosites.

3. The photosensitive chip as in claim 2, wherein each linear array receives one translucent filter material selected from the group consisting of red, green and blue.

4. The photosensitive chip as in claim 1, wherein the opaque layer is formed from a red translucent filter material and a blue translucent filter material.

5. The photosensitive chip as in claim 1, wherein the opaque layer is formed from a black filter material.

6. The photosensitive chip as in claim 1, wherein the photosites have a pixel width in a range of 55.5 micrometers to 59.5 micrometers.

7. The photosensitive chip as in claim 1, wherein the pitch of the edge photosite is slightly different from the uniform pitch of the other photosites, so that the pixel width of each photosite is in a range of 55.5 micrometers to 61.5 micrometers.

8. The photosensitive chip as in claim 1, wherein each photosite has a corresponding photosensor.

9. The photosensitive chip as in claim 1, wherein the photosites have a pitch, which provides a modulation transfer function amplitude of 0.1 or less at the sampling frequency.

10. An assembly comprising:
    a substrate; and
    a plurality of photosensitive chips attached to the substrate, each of the chips juxtaposed with one another, wherein each chip comprises:
    an edge;
    at least one linear array of photosites having a uniform pitch and including at least one edge photosite; and
    an opaque layer being deposited between the edge of the photosensitive chip and said at least one edge photosite.

11. The assembly as in claim 10, wherein the chip comprises three linear arrays of photosites with three edge photosites, and wherein an opaque layer is deposited between the edge of the chip and the edge photosites.

12. The assembly as in claim 11, wherein each linear array receives one translucent filter material selected from the group consisting of red, green and blue.

13. The assembly as in claim 10, wherein the opaque layer is formed from a red translucent filter material and a blue translucent filter material.

14. The assembly as in claim 10, wherein the opaque layer is formed from a black filter material.

15. The assembly as in claim 10, wherein the photosites have a pixel width in a range of 55.5 micrometers to 59.5 micrometers.

16. The assembly as in claim 10, wherein the pitch of the edge photosite is slightly different from the uniform pitch of the other photosites, so that the pixel width of each photosite is in a range of 55.5 micrometers to 61.5 micrometers.

17. The assembly chip as in claim 10, wherein each photosite has a corresponding photosensor.

18. The assembly as in claim 10, wherein the photosites have a pitch, which provides a modulation transfer function amplitude of 0.1 or less at the sampling frequency.

19. A digital device comprising:
    a raster input scanner scanning documents to generate digital image signals, the raster input scanner including a plurality of generally rectangular chips, which are assembled end to end on a substrate forming a full width array of at least one linear array of photosites, wherein each chip comprises:
    an edge;
    at least one linear array of photosites having a uniform pitch and including at least one edge photosite; and
    an opaque layer being deposited between the edge of the photosensitive chip and said at least one edge photosite.

* * * * *